(12) United States Patent
Byun

(10) Patent No.: US 7,738,315 B2
(45) Date of Patent: Jun. 15, 2010

(54) CIRCUIT FOR GENERATING OUTPUT ENABLE SIGNAL IN SEMICONDUCTOR MEMORY APPARATUS

(75) Inventor: Hee-Jin Byun, Ichon (KR)

(73) Assignee: Hynix Semiconductor Inc. (KR)

( * ) Notice: Subject to any disclaimer, the term of this patent is extended or adjusted under 35 U.S.C. 154(b) by 131 days.

(21) Appl. No.: 11/959,269

(22) Filed: Dec. 18, 2007

(65) Prior Publication Data

US 2008/0222442 A1    Sep. 11, 2008

(30) Foreign Application Priority Data

Mar. 8, 2007    (KR) ..................... 10-2007-0022958

(51) Int. Cl.
*G11C 8/00*    (2006.01)

(52) U.S. Cl. .............................. 365/233.1; 365/189.05; 365/194; 365/233.17; 365/233.18

(58) Field of Classification Search .............. 365/233.1, 365/189.05, 194, 233.17, 233.18; 327/158, 327/291

See application file for complete search history.

(56) References Cited

U.S. PATENT DOCUMENTS

| | | | |
|---|---|---|---|
| 5,764,584 A * | 6/1998 | Fukiage et al. | ......... 365/230.03 |
| 6,446,180 B2 | 9/2002 | Li et al. | |
| 6,977,848 B2 | 12/2005 | Choi | |
| 6,982,924 B2 * | 1/2006 | Na | ............... 365/154 |
| 6,987,705 B2 | 1/2006 | Kim et al. | |
| 7,027,336 B2 | 4/2006 | Lee | |
| 7,081,784 B2 | 7/2006 | Kang | |
| 7,233,533 B2 * | 6/2007 | Lee | ............. 365/194 |
| 2007/0070790 A1 * | 3/2007 | Choi | ............ 365/233 |

FOREIGN PATENT DOCUMENTS

| | | |
|---|---|---|
| JP | 2004-327008 | 11/2004 |
| KR | 1020040048554 | 6/2004 |
| KR | 1020060075611 A | 7/2006 |

* cited by examiner

*Primary Examiner*—Anh Phung
*Assistant Examiner*—Toan Le
(74) *Attorney, Agent, or Firm*—Baker & McKenzie LLP

(57) ABSTRACT

A circuit for generating an output enable signal in a semiconductor memory apparatus which can include an interval setting unit capable of delaying a burst length signal in synchronized with a clock, thereby generating an interval setting signal, and a signal generating unit for generating an output enable signal in response to a read command signal and the interval setting signal.

12 Claims, 4 Drawing Sheets

US 7,738,315 B2

CIRCUIT FOR GENERATING OUTPUT ENABLE SIGNAL IN SEMICONDUCTOR MEMORY APPARATUS

CROSS-REFERENCE TO RELATED PATENT APPLICATION

This application claims the benefit under 35 U.S.C 119(a) of Korean Patent Application No. 10-2007-0022958, filed on Mar. 8, 2007, in the Korean Intellectual Property Office, the disclosure of which is incorporated herein in its entirety by reference as if set forth in full.

BACKGROUND

1. Technical Field

The embodiments described here relate to a semiconductor memory apparatus, and, in particular, to a circuit for generating an output enable signal in a semiconductor memory apparatus, which supports stable data output operations.

2. Related Art

A conventional, semiconductor memory apparatus can include a plurality of data output drivers (DQ) and a plurality of data output strobe signal drivers (DQS), for performing data output operations. The data output driver performs the operation of receiving rising and falling data output clocks transmitted from a data output clock generator and then synchronizing data with the respective clocks. The data output clock generator generates the rising data output clock using an output enable signal and a rising clock having a high level at a rising edge time of a delay locked loop (DLL) clock output from a DLL circuit. The data output clock generator generates the falling data output clock using an output enable signal and a falling clock having a high level at a falling edge time of the (DLL) clock output from the DLL circuit. The semiconductor memory device includes a circuit for generating an output enable signal, thereby generating an output enable signal from a command signal, a burst length signal and a clock.

SUMMARY

A circuit for generating an output enable signal in a lo semiconductor memory apparatus, which can prevent malfunction due to the timing difference of the output enable signal from a data output clock is described herein. Additionally, In one aspect, a circuit for generating an output enable signal in a semiconductor memory apparatus, which can be stable and can perform data output operations regardless of a PVT (Process, Voltage and Temperature) fluctuation or a change in the frequency of a clock.

One embodiment described herein can include a circuit for generating an output enable signal in a semiconductor memory apparatus comprises an interval setting unit configured to delay a burst length signal in synchronization with a clock, thereby generating an interval setting signals; and a signal generating unit configured to generate an output enable signal in response to a read command signal and the interval setting signal.

In another aspect, a circuit for generating an output enable signal in a semiconductor memory apparatus comprises an interval setting unit configured to drive and latch a burst length signal depending on a voltage level of a clock, thereby outputting an interval setting signals, and a signal generating unit configured to include a flip flop section for receiving a read command signal and the interval setting signal, and to generate an output enable signal in response to an output of the flip flop section.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF THE PREFERRED EMBODIMENTS

Figure 1:
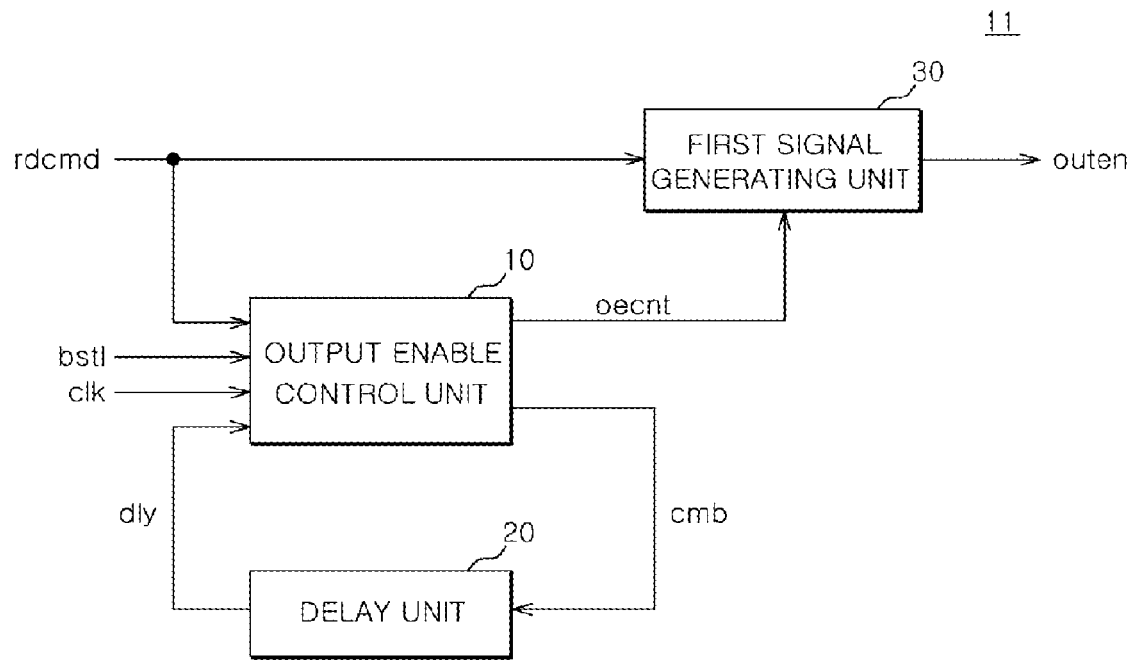
FIG. 1 is a block diagram illustrating the configuration of a circuit for generating an output enable signal in a semiconductor memory apparatus according to one embodiment.

FIG. 1 is a block diagram illustrating the configuration of a circuit 11 for generating an output enable signal in a semiconductor memory apparatus according to one embodiment. Referring to FIG. 1, the circuit 11 for generating an output enable signal can include an output enable control unit 10, a delay unit 20 and a first signal generating unit 30. The output enable control unit 10 can receive a burst length signal (bstl), a clock (clk) and a delay signal (dly) to generate an output enable control signal (oecnt) and a combination signal (cmb). The delay unit 20 can receive the combination signal (cmb) and can generate the delay signal (dly). The first signal generating unit 30 can receive a read command signal (rdcmd) and the output enable control signal (oecnt) and can generate an output enable signal (outen).

Figure 2:
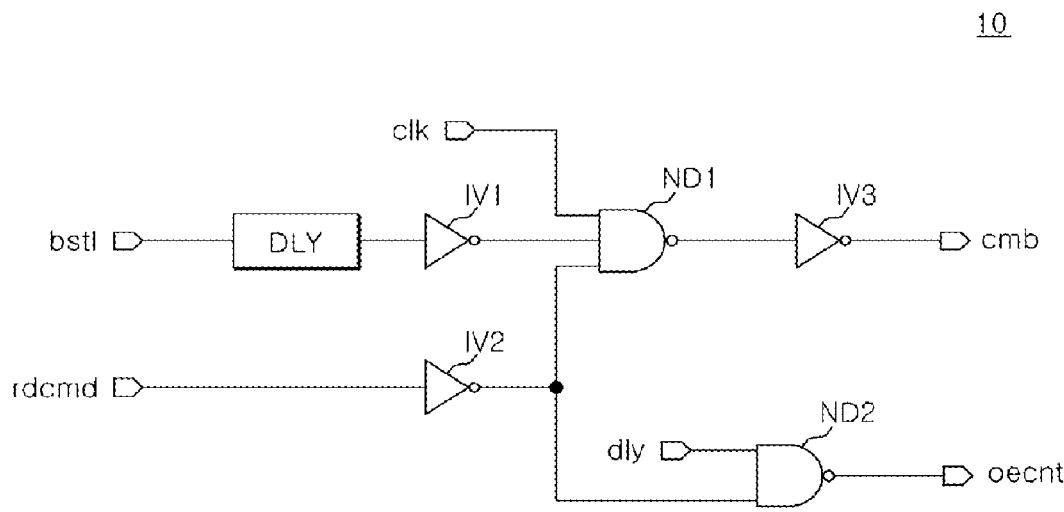
FIG. 2 is a circuit diagram illustrating the detailed configuration of an output enable control unit that can be included in the circuit illustrated in FIG. 1.

FIG. 2 is a circuit diagram illustrating the detailed configuration of an output enable control unit that can be included in the circuit 11 for generating an output enable signal. Referring to FIG. 2, the output enable control unit 10 can include a delayer DLY, a first inverter IV1, a second inverter IV2, a third inverter IV3, a first NAND gate ND1 and a second NAND gate ND2.

The delayer DLY can receive the burst length signal lo (bstl). The first inverter IV1 can receive an output signal of the delayer DLY. The second inverter IV2 can receive the read command signal (rdcmd). The first NAND gate ND1 can receive the clock (clk), an output signal of the first inverter IV1, and an output signal of the second inverter IV2. The third inverter IV3 can receive an output signal of the first NAND gate ND1 to output the combination signal (cmb). The second NAND gate ND2 can receive the delay signal (dly) and the output signal of the second inverter IV2 and can generate the output enable control signal (oecnt).

Figure 3:
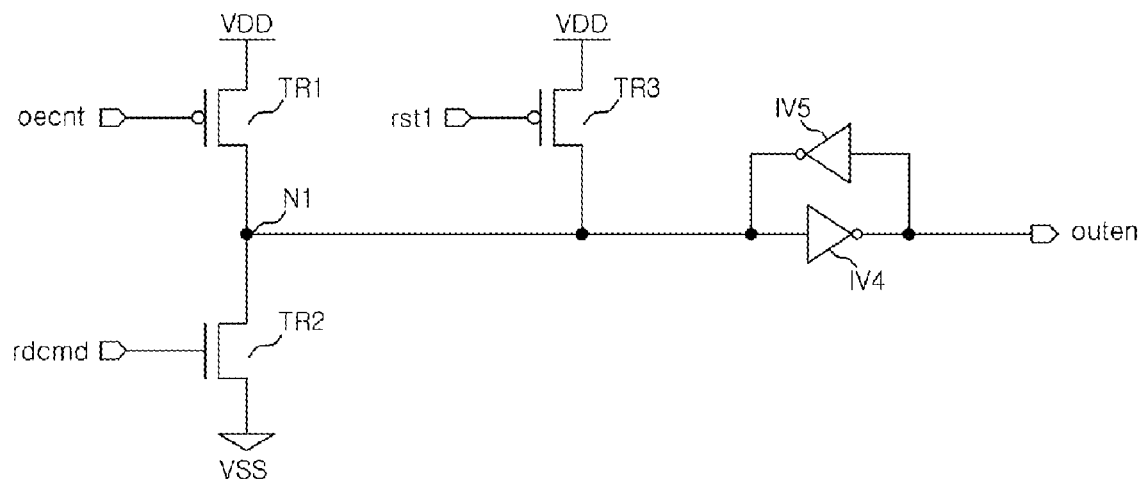
FIG. 3 is a circuit diagram illustrating the detailed configuration of a first signal generating unit that can be included in the circuit illustrated in FIG. 1.

FIG. 3 is a circuit diagram illustrating the detailed configuration of a first signal generating unit that can be included in the circuit 11 illustrated in FIG. 1. Referring to FIG. 3, the first signal generating unit 30 can include a first transistor TR1, a second transistor TR2, a third transistor TR3, a fourth inverter IV4, and a fifth inverter IV5.

The first transistor TR1 can include a gate, which receives the output enable control signal (oecnt), a source to which external supply power VDD is applied, and a drain coupled with a first node N1. The second transistor TR2 can include a gate, which can receive the read command signal (rdcmd), a drain coupled with the first node N1, and a source coupled with a ground power VSS. The third transistor TR3 can include a gate which can receive a first reset signal (rst1), a source to which the external supply power VDD is applied, and a drain coupled with the first node N1. The fourth inverter IV4 can receive a voltage applied at the first node N1 and can generate the output enable signal (outen). The fifth inverter IV5 can be configured as a latch structure with the fourth inverter IV4.

Figure 4:
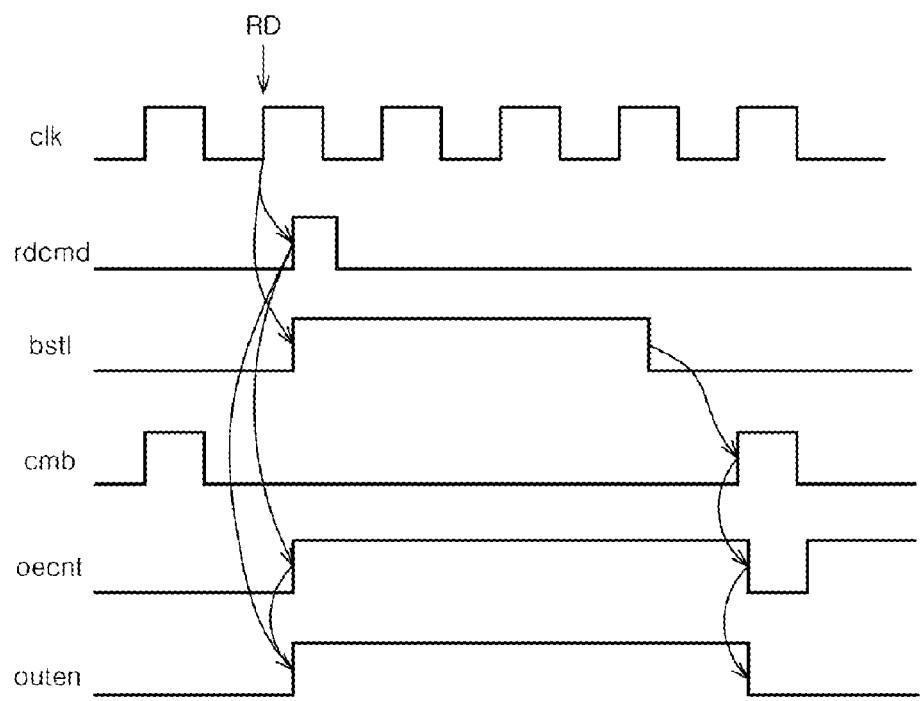
FIG. 4 is a timing diagram illustrating the operation of the circuit illustrated in FIG. 1.

FIG. 4 is a timing diagram illustrating the operation of the circuit 11 for generating an output enable signal. Referring to FIG. 4, if a read command (RD) is input to the semiconductor memory apparatus at a rising edge time of the clock (clk), the read command signal (rdcmd) can be enabled in the form of a pulse. At this time, a burst length signal (bstl) can also be enabled. An enable time of the burst length signal (bstl) can be maintained in accordance with a predetermined burst length. For example, if the predetermined burst length is 4, the enable time of the burst length signal (bstl) can be continuously maintained until after the second rising edge time of the clock (clk) from an input of the read command (RD). If the predetermined burst length is 8, the enable time of the burst length signal (bstl) is continuously maintained until after the fourth rising edge time of the clock (clk) from the input of the read command (RD). In the embodiment illustrated in FIG. 4, the predetermined burst length is 8.

The output enable control unit 10 can generate a combination signal (cmb) in response to a clock (clk), a read command signal (rdcmd) and a burst length signal (bstl). The delay unit 20 can delay the combination signal (cmb) to generate the delay signal (dly). Then, the output enable control unit 10 can generate an output enable control signal (oecnt) in response to a delay signal (dly) and a read command signal (rdcmd). The first signal generating unit 30 can output an output enable signal (outen) in response to the read command signal (rdcmd) and the output enable control signal (oecnt).

As described above, in a circuit for generating an output enable signal in a semiconductor memory apparatus, according to one embodiment, the output enable control unit 10 can incorporate the delayer DLY and can generate the combination signal (cmb). The output enable control signal (oecnt) can also be generated due to the delay signal (dly) being delayed by the delay unit 20. As described above, each of the delay elements provided is not influenced by a clock and provides only a delay time corresponding to a predetermined amount of time with respect to an input signal.

Various elements in a semiconductor memory apparatus have characteristics that can change depending on PVT or various external factors. The amount of delay generated by the delayers in the semiconductor memory apparatus can be different from a predetermined delay amount. In addition, each of the delayers is not operated in synchronization with a clock. This is one reason that if the frequency of the clock is finely changed, timing between the output enable signal (outen) and the clock may be mismatched.

Figure 5:
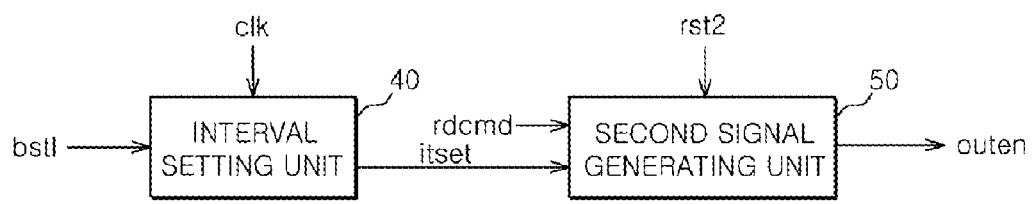
FIG. 5 is a block diagram illustrating the configuration of a circuit for generating an output enable signal in a semiconductor memory apparatus according to another embodiment.

FIG. 5 is a block diagram illustrating the configuration of a circuit 51 for generating an output enable signal in a semiconductor memory apparatus according to another embodiment. Referring to FIG. 5, the circuit 51 for generating an output enable signal in a semiconductor memory apparatus can include an interval setting unit 40, which can generate an interval setting signal (itset) by delaying a burst length signal (bstl) isynchronized with a clock (clk), and a second signal generating unit 50 which can generate an output enable signal (outen) in response to a read command signal (rdcmd) and the interval setting signal (itset).

If the clock (clk) is in a first level (e.g., a low level), the interval setting unit 40 can non-inversely drive and latch the burst length signal (bstl). Then, if a logic level of the clock (clk) becomes a second level (e.g., a high level), the interval setting unit 40 can inversely drive and latch the latched signal to generate the interval setting signal (itset).

The second signal generating unit 50 can enable the output enable signal (outen) at a time when the read command signal (rdcmd) is enabled. The second signal generating unit 50 can then disable the output enable signal (outen) at a time when the interval setting signal (itset) is enabled and then disabled. The second signal generating unit 50 can include a circuit for initializing the output enable signal (outen) in response to a second reset signal (rst2). The interval setting signal (itset) may be implemented as a low enable signal.

Through such a configuration, the interval setting signal (itset) can have an enable interval at which it is synchronized with the clock (clk). Since the interval setting signal (itset) can be a signal generated by delaying the burst length signal (bstl) in synchronization with the clock (clk), the enable interval is not changed regardless of the clock (clk). Hence, the output enable signal (outen) generated by the interval setting signal (itset) has an enable interval linked with the clock (clk).

Figure 6:
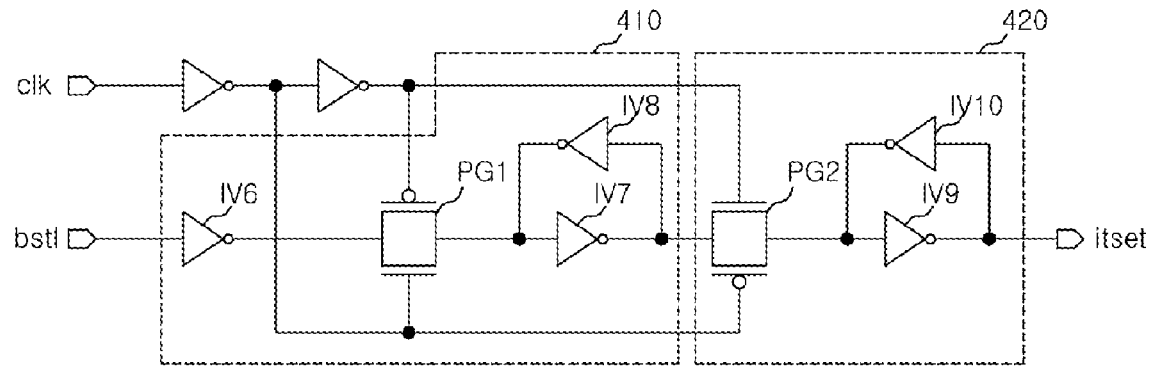
FIG. 6 is a circuit diagram illustrating the detailed configuration of an interval setting unit that can be included in the circuit illustrated in FIG. 5.

FIG. 6 is a circuit diagram illustrating the detailed configuration of an interval setting unit 40 that can be included in the circuit lo illustrated in FIG. 5. Referring to FIG. 6, the interval setting unit 40 can include a first latch section 410, which can non-inversely drive and latch the burst length signal (bstl) when the clock (clk) is in a low level, and a second latch section 420 which can inversely drive and latch an output signal of the first latch section 410 when the clock (clk) is in a high level.

The first latch section 410 can include a sixth inverter IV6, a seventh inverter IV7, an eighth inverter IV8, and a first pass gate PG1. The sixth inverter IV6 can receive the burst length signal (bstl). If the clock (clk) is in a low level, the first pass gate PG1 can allow an output signal of the sixth inverter IV6 to pass through. The seventh inverter IV7 can receive a signal passing through the first pass gate PG1. The eighth inverter IV8 can be configured as a latch structure with the seventh inverter IV7.

The second latch section 420 can includes a second pass gate PG2, a ninth inverter IV9 and a tenth inverter IV10. If the clock (clk) is in a high level, the second pass gate PG2 can allow an output signal of the seventh inverter IV7 to pass through. The ninth inverter IV9 can receive an output signal of the second pass gate PG2 and can generate the interval setting signal (itset). The tenth inverter IV10 can be configured as a latch structure with the ninth inverter IV9.

As described above, the interval setting signal (itset) can be generated in synchronization with the clock (clk). That is, if the voltage level of the burst length signal (bstl) is changed, the voltage level of the interval setting signal (itset) is changed only when the clock (clk) is in a low lo level and then in a high level again. Hence, in a PVT fluctuation or a change in the frequency of the clock (clk), it is possible to prevent the enable interval of the interval setting signal (itset) from being changed regardless of the clock (clk).

Figure 7:
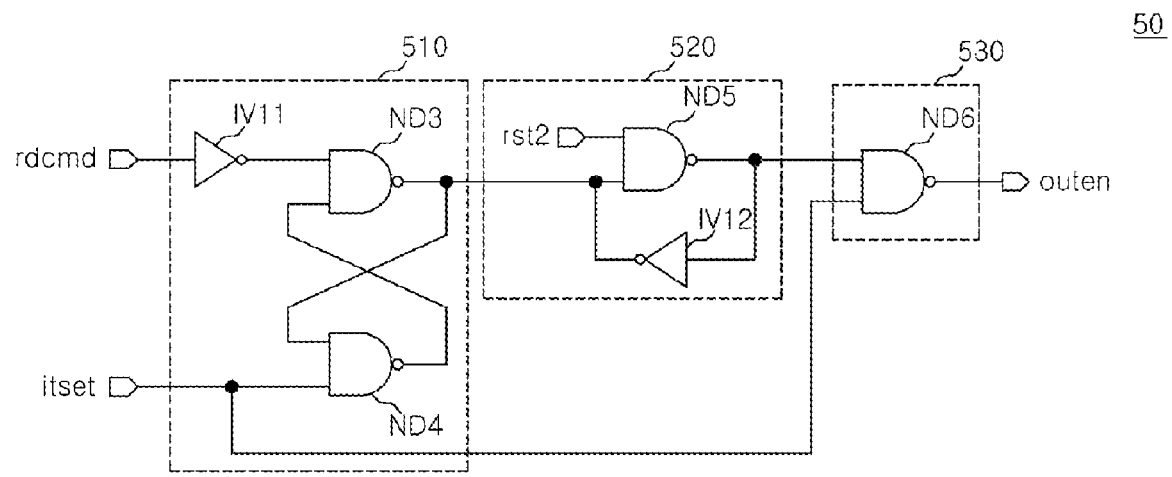
FIG. 7 is a circuit diagram illustrating the detailed configuration of a second signal generating unit that can be included in the circuit illustrated in FIG. 5.

FIG. 7 is a circuit diagram illustrating the detailed configuration of a second signal generating unit 50 that can be included in the circuit illustrated in FIG. 5. Referring to FIG. 7, the second signal generating unit 50 can include a flip flop section 510, a reset section 520, and a signal combining section 530. The flip flop section 510 can receive the read command signal (rdcmd) and the interval setting signal (itset). The reset section 520 can initialize an output signal of the flip flop section 510 in response to the second reset signal rst2. The signal combining section 530 can combine the interval setting signal (itset) and an output signal of the reset section 520 and can generate the output enable signal (outen).

The flip flop section 510 can include an eleventh inverter IV11, a third NAND gate ND3, and a fourth NAND gate ND4. The eleventh inverter IV11 can receive the read command signal (rdcmd). The third NAND gate ND3 can receive an output signal of the eleventh inverter IV11 and an output signal of the fourth NAND gate ND4. The fourth NAND gate ND4 can receive the interval setting signal itset and an output signal of the third NAND gate ND3.

The reset section 520 can include a fifth NAND gate ND5 which can receive the second reset signal (rst2) and the output signal of the third NAND gate ND3 in the flip flop section 510, and a twelfth inverter IV12 lo which can constitute a latch structure with the fifth NAND gate ND5, which can thereby transmit an output signal of the latch structure to a terminal which receives the output signal of the third NAND gate ND3.

The signal combining section 530 can include a sixth NAND gate ND6 which can receiving an output of the fifth NAND gate ND5 in the reset section 520 and the interval setting signal (itset) and can generate the output enable signal (outen).

Here, the second reset signal (rst2) can be a low enable signal. If the second reset signal (rst2) is enabled in the state that the interval setting signal (itset) is in a high level, high-level signals can be input to the sixth NAND gate ND6 of the signal combining section 530. For this reason, the output enable signal (outen) can be disabled as a low level.

In one embodiment, if the read command signal (rdcmd), which was initially in a low level is in a high level when the second reset signal (rst2) is in a high level, the output signal of the flip flop section 510, i.e., the output signal of the third NAND gate ND3 is in a high level. Hence, the output signal of the reset section 520, i.e., the output signal of the fifth NAND gate ND5, is in a low level, and the output enable signal outen that is an output signal of the signal combining section 530, i.e., the output signal of the sixth NAND gate ND6, is enabled as a high level. After that, the state of the output enable signal (outen) is not changed even though the read command signal (rdcmd) is in a low level.

In this state, if the interval setting signal (itset) is in a low level, the sixth NAND gate ND6 can receive the low-level interval lo setting signal (itset), and thus the output enable signal (outen) can maintain an enable state. Meanwhile, if the interval setting signal (itset) is then in a high level, the output signal of the flip flop section 510 can be in a low level, and the output signal of the reset section 520 can be in a high level. For this reason, the output enable signal (outen), generated from the signal combining section 530, is disabled as a low level. Additionally, one embodiment of the signal generating unit 50 of the circuit for generating an output enable signal in the semiconductor memory apparatus can include a flip flop circuit, it can more stably perform operations.

Figure 8:
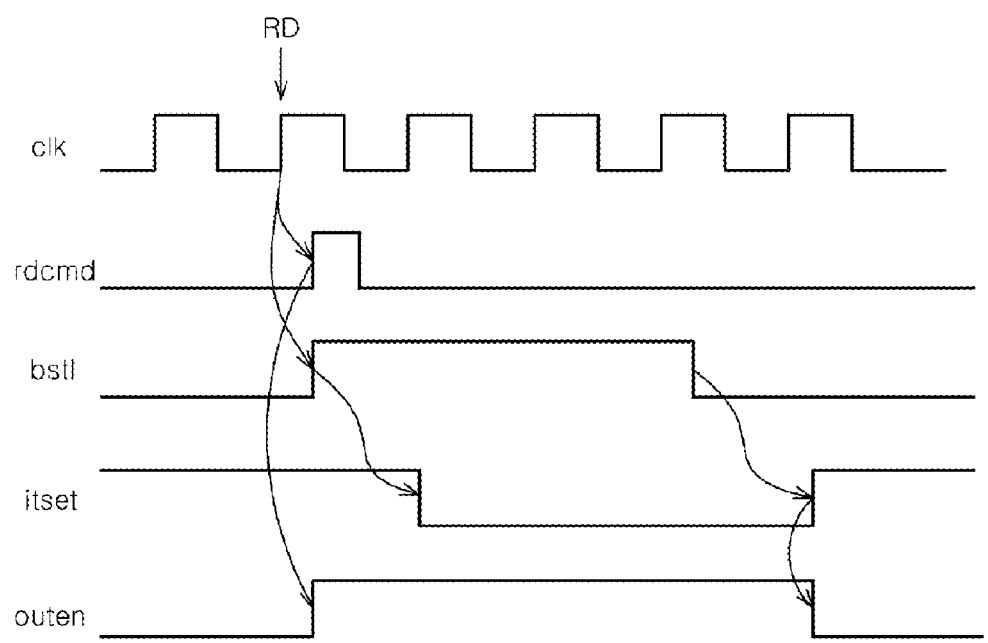
FIG. 8 is a timing diagram illustrating the operation of the circuit illustrated in FIG. 5.

FIG. 8 is a timing diagram illustrating the operation of the circuit for generating an output enable signal in a semiconductor memory apparatus that can be included in the circuit illustrated in FIG. 5. Referring to FIG. 8, if a read command RD is input, the read command signal (rdcmd) and the burst length signal (bstl) can be enabled. In addition, the burst length signal (bstl) can be inversely delayed such that the interval setting signal (itset) is enabled. Here, a delay amount of the interval setting signal (itset) can be synchronized with the clock (clk). After that, the output enable signal (outen) can be enabled by the read command signal (rdcmd), and can be disabled by the interval setting signal (itset).

As described through the embodiments, the circuit for generating an output enable signal in a semiconductor memory apparatus according one embodiment can generate an interval setting signal which has an enable interval in synchronization with a clock, and can generate an output enable signal which can have an enable interval linked with a clock using the interval setting signal. Accordingly, it is possible to prevent a malfunction where the timing between the output enable signal and the clock can be mismatched by a change in characteristics of delayers due, for example, to a PVT fluctuation or a change in the frequency of a clock. Therefore, the circuit for generating an output enable signal in a semiconductor memory apparatus, according to one embodiment, can generate an output enable signal which has a stable enable interval, and thereby increase stability while performing data output operations.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A circuit for generating an output enable signal in a semiconductor memory apparatus, comprising:
    an interval setting unit configured to delay a burst length signal in synchronization with a clock, thereby generating an interval setting signal; and
    a signal generating unit configured to generate an output enable signal in response to a read command signal and the interval setting signal.

2. The circuit of claim 1, wherein the interval setting unit is configured to generate the interval setting signal by delaying the burst length signal for a time corresponding to a predetermined period of the clock.

3. The circuit of claim 2, wherein the interval setting unit comprises:
    a first latch section configured to drive and latch the burst length signal when the clock is in a first level; and
    a second latch section configured to drive and latch an output signal of the first latch section when of the clock is in a second level.

4. The circuit of claim 1, wherein the signal generating unit is configured to enable the output enable signal at a time when the read command signal is enabled, and then to disable the output enable signal at a time when the interval setting signal is disabled.

5. The circuit of claim 4, wherein the signal generating unit further comprises a configuration for initializing the output enable signal in response to a reset signal.

6. The circuit as claimed in claim 5, wherein the signal generating unit comprises:
- a flip flop section configured to receive the read command signal and the interval setting signal;
- a reset section configured to initialize an output signal of the flip flop section in response to the reset signal; and
- a signal combining section configured to combine the interval setting signal and an output signal of the reset section to output the output enable signal.

7. A circuit for generating an output enable signal in a semiconductor memory apparatus, comprising:
- an interval setting unit configured to drive and latch a burst length signal depending on a voltage level of a clock, thereby outputting an interval setting signal; and
- a signal generating unit configured to include a flip flop section for receiving a read command signal and the interval setting signal, and to generate an output enable signal in response to an output of the flip flop section.

8. The circuit of claim 7, wherein the interval setting unit is configured to generate the interval setting signal by delaying the burst length signal for a time corresponding to a predetermined period of the clock.

9. The circuit of claim 8, wherein the interval setting unit comprises:
- a first latch section configured to drive and latch the burst length signal when the clock is in a first level; and
- a second latch section configured to drive and latch an output signal of the first latch section when the clock is a second level.

10. The circuit of claim 7, wherein the signal generating unit is configured to enable the output enable signal at a time when the read command signal is enabled, and then is configured to disable the output enable signal at a time when the interval setting signal is disabled.

11. The circuit of claim 10, wherein the signal generating unit further comprises a configuration for initializing the output enable signal in response to a reset signal.

12. The circuit of claim 11, wherein the signal generating unit comprises:
- a flip flop section configured to receive the read command signal and the interval setting signal;
- a reset section configured to initialize an output signal of the flip flop section in response to the reset signal; and
- a signal combining section configured to combine the interval setting signal and an output signal of the reset section to output the output enable signal.

* * * * *